(12) United States Patent
Ohashi

(10) Patent No.: US 7,980,294 B2
(45) Date of Patent: Jul. 19, 2011

(54) LIQUID COOLING SYSTEM

(75) Inventor: Shigeo Ohashi, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/288,097

(22) Filed: Nov. 29, 2005

(65) Prior Publication Data
US 2006/0185826 A1  Aug. 24, 2006

(30) Foreign Application Priority Data

Feb. 24, 2005 (JP) .................................. 2005-048293

(51) Int. Cl.
*H05K 7/20* (2006.01)
(52) U.S. Cl. ............... 165/104.24; 165/104.33; 361/700
(58) Field of Classification Search ............. 165/104.24, 165/104.33; 361/700; 417/48, 52, 207, 208
See application file for complete search history.

(56) References Cited

U.S. PATENT DOCUMENTS

| | | | | | |
|---|---|---|---|---|---|
| 1,686,887 | A | * | 10/1928 | Van Hise | 417/52 |
| 2,518,621 | A | * | 8/1950 | Hull et al. | 123/41.21 |
| 3,087,438 | A | * | 4/1963 | Ciesielski | 417/207 |
| 3,898,017 | A | * | 8/1975 | Mandroian | 417/65 |
| 4,120,172 | A | * | 10/1978 | Pierce | 62/115 |
| 4,556,368 | A | * | 12/1985 | Jean et al. | 417/208 |
| 4,792,283 | A | * | 12/1988 | Okayasu | 417/52 |
| 4,986,348 | A | * | 1/1991 | Okayasu | 165/104.24 |
| 5,816,313 | A | * | 10/1998 | Baker | 165/41 |
| 5,881,801 | A | * | 3/1999 | Hayakawa et al. | 165/104.24 |
| 5,975,856 | A | * | 11/1999 | Welle | 417/53 |
| 6,071,081 | A | * | 6/2000 | Shiraishi | 417/52 |
| 6,123,512 | A | * | 9/2000 | Benner et al. | 417/209 |
| 2003/0062149 | A1 | * | 4/2003 | Goodson et al. | 165/104.11 |
| 2004/0050538 | A1 | * | 3/2004 | Sunder et al. | 165/133 |
| 2006/0065386 | A1 | * | 3/2006 | Alam | 165/104.33 |

FOREIGN PATENT DOCUMENTS

| | | |
|---|---|---|
| JP | 2002-182797 | 6/2002 |
| JP | 2002-188876 | 7/2002 |
| JP | 2002-189535 | 7/2002 |
| JP | 2002-189536 | 7/2002 |
| JP | 2003-022148 | 1/2003 |
| JP | 2003-304086 | 10/2003 |

* cited by examiner

Primary Examiner — Teresa J Walberg
(74) Attorney, Agent, or Firm — Antonelli, Terry, Stout & Kraus, LLP.

(57) ABSTRACT

For providing a liquid cooling system for an electronic apparatus having a heat-generating element within a housing thereof, enabling small-sizes thereof and being effective for lowering noises when the apparatus is operated, equipped with a new type of a driving means for a liquid coolant therein, comprises a heat-receiving jacket 100 for transferring heat generated from the heat-generating element to a liquid coolant, to evaporate it, within an inside thereof; a radiator 200 for guiding the evaporated coolant supplied from the heat-receiving jacket into an inside thereof, so as to cool it to be liquefied; and a driving means 300 for applying driving force for circulating the liquid coolant, through repetition of heating and cooling upon a portion of the liquefied liquid coolant supplied from the radiator, while restricting a flow direction of the liquid coolant within an inside thereof into one direction, whereby circulating said liquid coolant within a circulation loop including the heat-receiving jacket, the radiator, and the driving means.

3 Claims, 3 Drawing Sheets

FIG.3
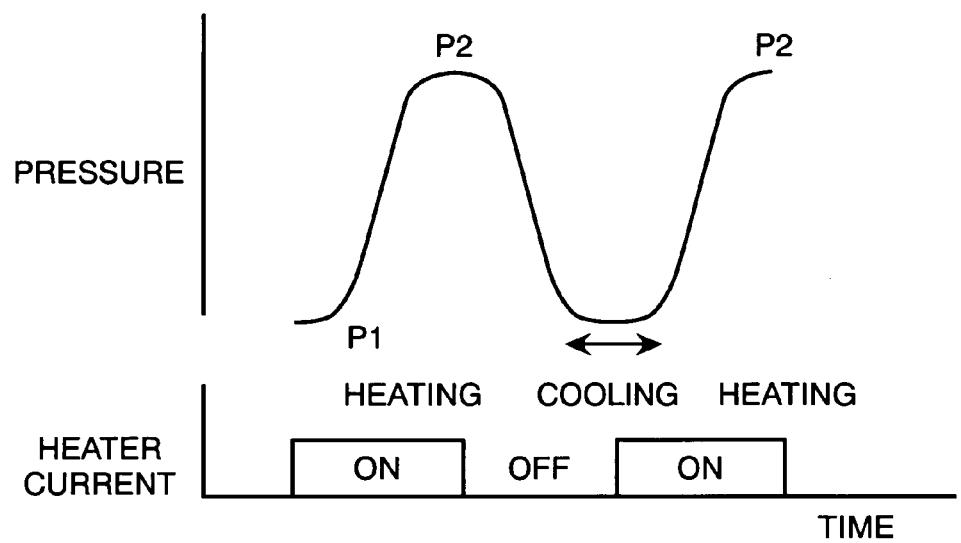
FIG.4(a) FIG.4(b)
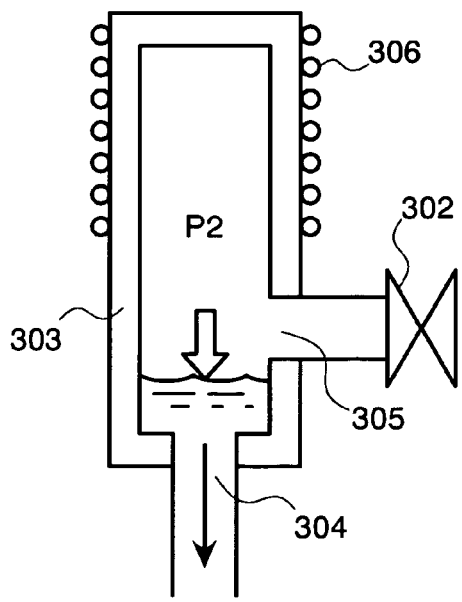 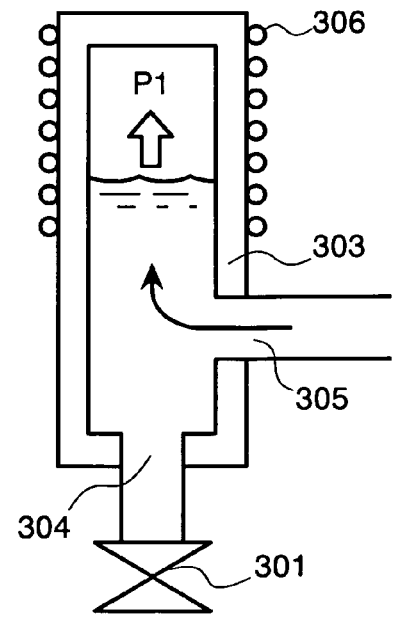

LIQUID COOLING SYSTEM

BACKGROUND OF THE INVENTION

The present invention relates to an electronic apparatus, such as, a personal computer and/or a server, etc., and in particular, it relates to a liquid cooling system, being enable to cool a semiconductor integrated circuit element mounted within an inside thereof, as being a heat-generating element, with using a liquid coolant, effectively.

In general, a heat-generating element, for example, a semiconductor integrated circuit element, which generates heat within the electronic apparatus, such as, a personal computer of desk-top type or notebook type, or a server, etc., and in particular, a CPU (i.e., a central processing unit), representatively, it needs a cooling for maintaining the normal operation thereof. Conventionally, for that reason, it is general that such cooling is achieved with using a heat-transfer body, which is built up with fins called by a heat sink, to be a unit, and also a fan for sending a cooling wind upon the surface thereof. However, in recent years, small-sizing and high-integration on the semiconductor integrated circuit element, as being the heat-generating element, causes a problem, such as, localizing portions of generating the heat within the heat-generating element. For that reason, in the place of the conventional cooling system of air-cooling type, attentions are paid upon a cooling system of liquid-type, with using a coolant therein, such as, a water or the like, for example, having a high cooling efficiency.

Namely, with the liquid-type cooling system of high cooling efficiency, which is applied in the personal computer and/or the server, etc., as is already known in the following patent documents, for example, in general, a member, being so-called by a heat-receiving (or cooling) jacket, is directly mounted upon the surface of the CPU, being the heat-generating body, while a liquid-like coolant is communicated within a flow passage, which is formed within an inside of that heat-receiving jacket; i.e., transmitting the heat generated from the CPU into the coolant flowing within the jacket mentioned above, thereby cooling down the heat-generating body with high efficiency. Further, within such the cooling system of liquid-cooling type, in general, there is built up a heat cycle, while applying the heat-receiving jacket as a heat-receiving portion thereof, and in more details thereof, comprising a circulation pump for circulating the liquid coolant within the cycle, so-called a radiator, being a heat radiation portion for radiating the heat of the liquid coolant into an outside thereof, and further a coolant tank, being provided in a portion of the cycle if necessary, and wherein those are connected in the structure thereof through tubes, being made of a metal, or an elastic material, such as, rubber, etc., for example.

Patent Document 1: Japanese Patent Laying-Open No. 2003-304086 (2003);
Patent Document 2: Japanese Patent Laying-Open No. 2003-022148 (2003);
Patent Document 3: Japanese Patent Laying-Open No. 2002-182797 (2002);
Patent Document 4: Japanese Patent Laying-Open No. 2002-189535 (2002);
Patent Document 5: Japanese Patent Laying-Open No. 2002-189536 (2002); and
Patent Document 6: Japanese Patent Laying-Open No. 2002-188876 (2002).

On the other hand, generally within such the cooling system relating to the conventional arts mentioned above, so-called a centrifugal pump is applied, widely, to be the circulation pump for driving the liquid coolant, which is provided in a portion of that heat cycle, due to the following reasons; i.e., a flow rate obtained therefrom is relatively large in an amount thereof, and noises are small, which are caused due to contact, etc. With such the circulation pump of applying such the centrifugal pump therein, however there is a necessity of providing an electric motor, separately, for the purpose of rotationally driving such the pump, although being also true for the case of applying a pump of other types therein; and for this reason, the circulation pump as whole comes to be relatively large in the sizes thereof.

On the other hand, in recent years, it is of course for the electronic apparatuses, including, such as, the personal computer of the desktop type and the server, etc., that demand or requirement for small-sizing thereof rises up to be higher and higher, in particular, upon the personal computer of the notebook type, for the purpose of improving the portability thereof. For this reason, under the present situation, it is not always possible to deal with such the requirement with the circulation pump of the conventional arts mentioned above. In addition thereto, further there is also demand or requirement increasing up, for lowering the noises generated during when such the electronic apparatus is operating.

BRIEF SUMMARY OF THE INVENTION

Then, according to the present invention, accomplished by taking the drawbacks of the conventional arts mentioned above into the consideration thereof, an object thereof is to provide a liquid cooling system, enabling the small-sizing thereof, and having a driving means of a new type, to be effective for lowering the noises during when the electronic apparatus is operating; therefore, being suitable to be applied into the personal computers of the desktop type and the notebook type, and also the server, etc.

For accomplishing the object mentioned above, according to the present invention, first of all, there is provided a liquid cooling system for an electronic apparatus having a heat-generating element within a housing thereof, comprising: a heat-receiving jacket for transferring heat generated from said heat-generating element to a liquid coolant, to evaporate it, within an inside thereof; a radiator for guiding the evaporated coolant supplied from said heat-receiving jacket into an inside thereof, so as to cool it to be liquefied; and a driving means for applying driving force for circulating said liquid coolant, through repetition of heating and cooling upon a portion of the liquefied liquid coolant supplied from said radiator, while restricting a flow direction of the liquid coolant within an inside thereof into one direction, whereby circulating said liquid coolant within a circulation loop including said heat-receiving jacket, said radiator, and said driving means.

According to the present invention, within the liquid cooling system as described in the above, preferably, said driving means includes a portion for storing therein a part of the liquefied liquid coolant supplied from said radiator, interior surface of which is treated with a process for accelerating the evaporation of the liquid coolant, or preferably, said driving means includes an electric heater provided in a portion thereof for storing a part of the liquefied liquid coolant supplied from said radiator.

Further, according to the present invention, within the liquid cooling system as described in the above, preferably, said driving means includes a check valve for restricting the flow direction of the liquid coolant within the inside thereof, or preferably, said heat-receiving jacket has interior surface, upon which a process is treated with for accelerating the evaporation of the liquid coolant.

According to the present invention mentioned above, there can be obtained an effect of providing a liquid cooling system, enabling the small-size thereof, through building up a transfer mechanism for the coolant with applying a phenomenon, so-called the thermal siphon, therein, and being effective for reducing the noises which are generated during the time when the apparatus is operated; therefore, it is possible to achieve a cooling effect, with certainty, irrespective of the positions where the heat-receiving jacket and the radiator are provided.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein:

FIG. 3 is a view for showing waveforms for explaining heat transfer operation of a coolant within the liquid cooling system mentioned above;

FIGS. 4(*a*) and 4(*b*) are views for explaining the operation of a liquid driving portion, for explaining the heat transfer operation of the coolant within the liquid cooling system mentioned above.

DETAILED DESCRIPTION OF THE INVENTION

Hereinafter, embodiments according to the present invention will be fully explained by referring to the attached drawings.

Figure 1:
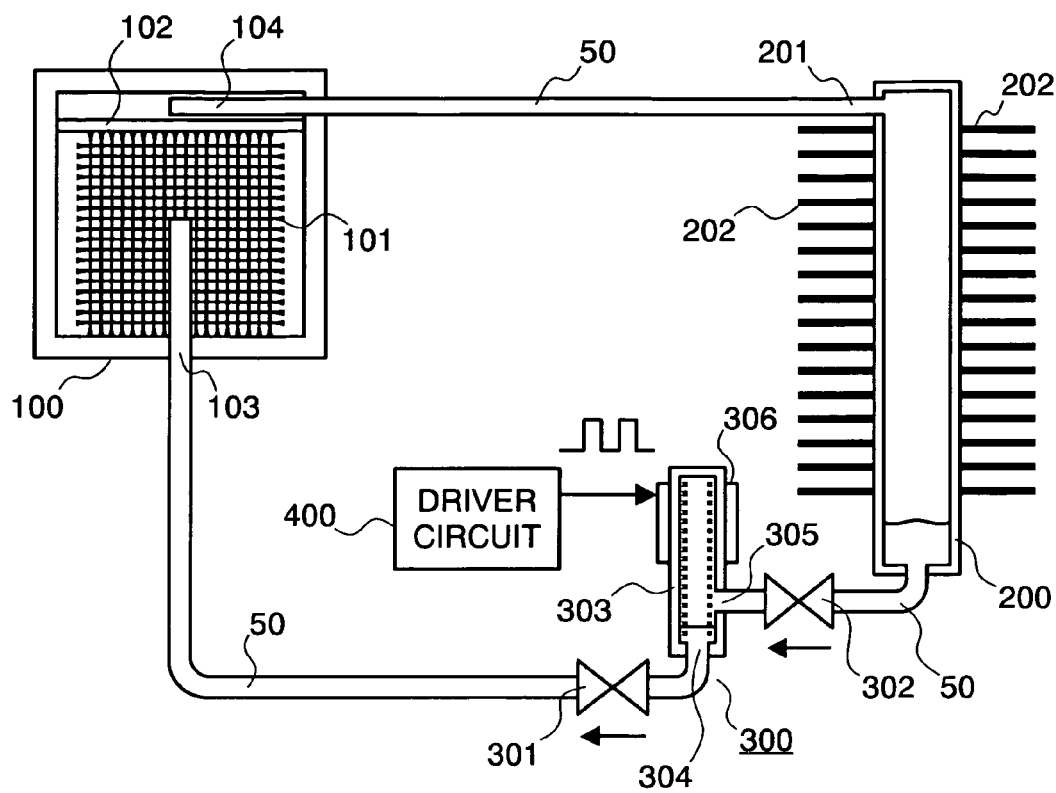
FIG. 1 is a view for showing the entire structure of the liquid cooling system, according to an embodiment of the present invention.

First of all, FIG. 1 attached herewith shows the entire structures of the liquid cooling system, according to one embodiment of the present invention, and basically, it comprises a heat-receiving jacket 100, a radiator 200, and a liquid driving apparatus for circulating a liquid coolant (for example, a pure water, etc.) within the liquid cooling system, wherein pipes or conduits 50, being made of a metal and so on, are connected between them, thereby building up a closed loop.

Explaining in more details thereof, the heat-receiving jacket 100 in the figure has a rectangular plate-like outer configuration, and it is made of a metal, such as, copper, aluminum, or the like, for example, being superior in the thermal or heat conductivity thereof. Internal structures of the heat-receiving jacket 100 is shown by a cross-section view thereof, in FIG. 2 attached herewith, and as is apparent from this FIG. 2, a bottom surface within an inside of the heat-receiving jacket 100 is so formed that it rises up at around the central portion thereof, and further upon the surface thereof, there are formed thin or fine grooves 101 in a large number thereof, intersecting with each other, for the purpose of keeping a liquid film of the coolant liquid thereon and/or accelerating evaporation thereof. Also, within the inside of that heat-receiving jacket 100 is attached a partition plate 102, thereby being divided into a portion where the liquid coolant flows into (i.e., a chamber at the right-hand side in FIG. 2), and a portion where only the evaporated coolant flows into (i.e., a chamber at the left-hand side in FIG. 2).

Further, within this portion where the liquid coolant flows into (i.e., the chamber at the left-hand side in FIG. 2), there is disposed a metal pipe or conduit (or a liquid transfer pipe) 103, extending up to a central portion thereof, through which flows the liquid coolant driven/supplied from a liquid driving apparatus 300, which will be explained later. On the other hand, within an inside of the portion where only the evaporated coolant flows into (i.e., the chamber at the left-hand side in FIG. 2), there is disposed a metal pipe or conduit (or a vapor transfer pipe) 104 for guiding the evaporated coolant into the radiator 200 mentioned above. Also, a reference mark W in the figure depicts the coolant within the inside thereof, and a reference numeral 600 depicts a heat-generating element, which is cooled by means of that heat-receiving jacket 100.

Also, the radiator 200 is made up with cooling fins 202 formed on the surface of a pipe of a metal, such as, copper, etc., for example, and it enables to accelerate condensation of the coolant evaporated therein, through treating channeling or cutting on an interior surface of the pipe. As is apparent from FIG. 1 mentioned above, the radiator introduces the evaporated coolant, which is supplied from the heat-receiving jacket 100, into the inside thereof through an inlet 201, which is provided in an upper portion thereof, so as to cool and condense the evaporated coolant through the function of the cooling fins, which are attached onto the wall surface of the radiator in a large number thereof. Thus, the evaporated coolant supplied from the heat-receiving jacket 100 is turned back to the liquid within the inside of that radiator 200, to be stored on a bottom portion thereof.

And, the liquid driving apparatus 300, for circulating the liquid coolant within that liquid cooling system, comprises a first check valve 301 and a second check valve 302, and further a liquid driving portion (or a transfer chamber) 303, having a cylindrical outer configuration, for example. Further, on the interior wall surface of this liquid driving portion 303 is treated so-called a wick machining or processing (indicated by broken lines in the figure), so as to roughen the surface thereof, thereby generating the surface tension thereupon. And, in this liquid driving portion 303, opening portions 304 and 305 are formed on a bottom wall and a side wall thereof, and they are attached with the first check valve 301 and the second check valve 302, respectively, in the directions shown in the figure. Further, on an upper portion of the liquid driving portion 303, there is attached so-called a heater 306, such as, a nichrome wire being wound around the periphery thereof, for example. Further, a reference numeral 400 in this figure depicts a driver circuit for supplying electric drive power for heating the heater 306 of that liquid driving apparatus 300.

Following to the above, explanation will be made about the operation of the liquid cooling system, in the details thereof, the structures of which are mentioned in the above, by referring to FIGS. 3 through 4(*b*). In this liquid cooling system, a pulse-like heater current is supplied from the driver circuit 400 to the heater 306 when it operates, as is shown in FIG. 1.

Also, as is shown in FIG. 3, when being supplied with the pulse-like current, the heater 306 of the liquid driving apparatus 300 is heated, thereby heating the liquid driving portion (or the transfer chamber) 303. For this reason, within the inside of the liquid driving portion 303, the liquid coolant is evaporated through the heating, thereby rising up the interior pressure thereof (P1→P2). In this instance, when the pressure within the inside of the liquid driving portion 303 comes to be higher than the pressure within the heat-receiving jacket 100, then the second check valve 302 is closed while the first check valve 301 is opened, as is shown in FIG. 4(a); therefore, the liquid coolant flows into the direction of an arrow, i.e., directing to the heat-receiving jacket 100, passing through the first check valve 301.

Thereafter, when stopping the pulse-like heater current to be supplied, the heater 306 also stops the heating; i.e., the liquid driving portion (i.e., the transfer chamber) 303 is rather cooled down. For this reason, within the inside of that liquid driving portion 303, the interior pressure therein falls down (P2→P1) due to decrease of liquid an amount of evaporation therein, as well as, the condensation of the evaporated coolant. Thus, in this instance, when the interior pressure within the liquid driving portion 303 falls down to be lower than the pressure within the radiator 200, then the first check valve 301 is closed while the second check valve 302 is opened, as is shown in FIG. 4(b); therefore, the liquid coolant flows into the direction of an arrow, i.e., directing to the inside of the liquid driving portion 303, passing through the second check valve 302. Namely, repeating the operations mentioned above, the liquid coolant, being supplied from the heat-receiving jacket 100, is condensed back into the liquid, while the coolant stored in the bottom portion within the radiator 200 is driven; therefore the coolant can move, sequentially, within the liquid cooling system mentioned above. An amount of heating by the heater 306 and a cycle of ON-OFF are determined upon the basis of an amount of heat transfer (i.e., an amount of heat-generation of the heat generating element 600), a sort or kind of the liquid coolant, and the difference in operation pressure of the check valves 301 and 302. However, an amount of heating by the heater 306 is sufficient to be very small, comparing to that of the amount of heat transfer, since it is enough only to cause an increase in pressure within the inside of the liquid driving portion 303 through evaporation of the liquid.

Figure 2:
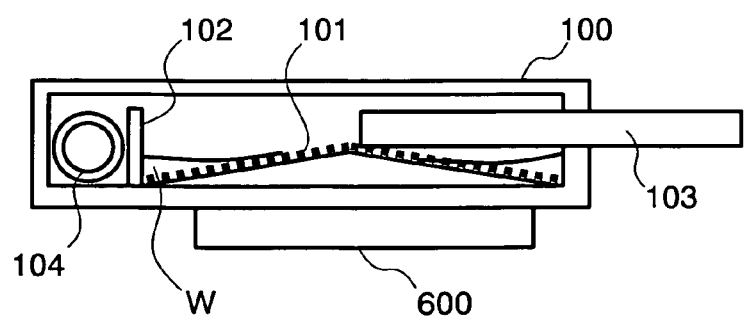
FIG. 2 is a cross-section view for explaining the detailed structure of an inside of a heat-receiving jacket in the liquid cooling system mentioned above.

However, in the explanation given in the above, the wick machining or processing is treated on the interior wall surface of the liquid driving portion (i.e., the transfer chamber) 303, and for this reason, within the inside of the liquid driving portion 303, the liquid coolant spreads all over the entire wall surface, easily, due to the surface tension thereupon; therefore, the liquid coolant can be evaporated, through the heating by means of the heater 305, easily. Also, due to the grooves 101 formed in a large number thereof, coming cross with each other, on the bottom surface within an interior of the heat-receiving jacket 100, in the similar manner, the liquid coolant within the inside thereof can be easily evaporated, and for that reason, an improvement or an increase can be obtained in the efficiency of cooling, when disposing the heat-receiving jacket 100 within a housing of the electronic apparatus, in particular, when attaching it on the surface of the heat-generating element 600, such as, being the CPU, reprehensibly, as is shown in FIG. 2. Further, the opening of the liquid transfer pipe 103, which is connected to the heat-receiving jacket, is extended up to the vicinity of a center of the evaporating surface thereof, so that the liquid can be easily supplied all over the surface of the evaporation surface. On the other hand, it is preferable, the vapor transfer pipe 104, which is connected to the heat-receiving jacket, is so constructed that the liquid coolant within the heat-receiving jacket 100 will not be sent out therefrom together with the vapor. For this reason, the opening of the vapor transfer pipe is extended up to a corner portion, along the side wall within the heat-receiving jacket 100; i.e., being disposed, so as to remain a gap for letting the vapor to pass through, between the opening and the side wall. Further, as is mentioned in the above, the portion where the liquid coolant flows into (i.e., the chamber at the right-hand side in FIG. 2) and the portion where only the evaporated coolant flows into (i.e., the chamber at the left-hand side in FIG. 2) are divided or separated by the partition plate 102, so that the liquid coolant W cannot reach to the opening of the vapor transfer pipe 104. Further, a gap may be provided, for example, for the vapor to pass through, between the partition plate 102 and a ceiling surface of the heat-receiving jacket 100, so that the vapor generated in the portion where the liquid coolant flows into (i.e., the chamber at the right-hand side in FIG. 2) can move into the portion where only the evaporated coolant flows into (i.e., the chamber at the left-hand side in FIG. 2). However, as was mentioned above, the coolant evaporated within the heat-receiving jacket 100 is guided into the radiator 200 due to the pressure thereof and also the functions of the first check valve 301.

As was mentioned in the above, according to the liquid cooling system mentioned above, it can made to be small in the sizes, through building up a transfer mechanism for the coolant with applying a phenomenon, so-called the thermal siphon, therein, and is effective for reducing the noises which are generated during the time when the apparatus is operated; therefore, it is possible to obtain a cooling effect, with certainty, irrespective of the positions where the heat-receiving jacket and the radiator are provided.

Figure 5:
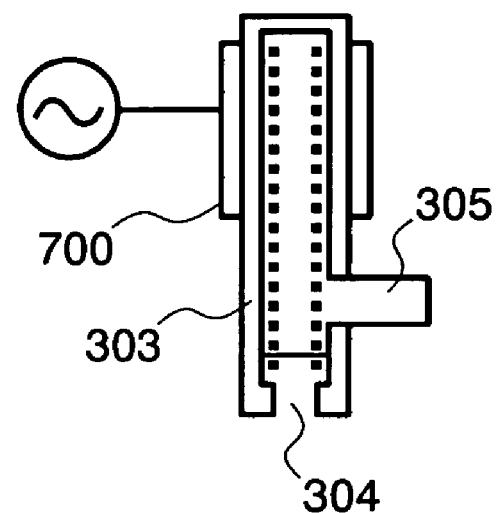
FIG. 5 is a view for showing the liquid driving portion, applying a Peltier element, for explaining other embodiment according to the present invention.

Further, in the embodiment mentioned above, although the explanation was given only about an example, wherein the heater 305 is used for heating the liquid driving portion 303 within the liquid driving apparatus 300 mentioned above, however the present invention should not be restricted thereto. As an embodiment other than that, as is shown in FIG. 5 attached, it is also possible to apply a Peltier element in the place of the heater 305 mentioned above, for example. However, in that case, as is shown in that figure, it is possible to exchange the Peltier element, between heating/cooling (rise-up/fall-down of temperature), actively, through applying an alternating electric power to that Peltier element, as is shown in that figure; thereby it is possible to obtain a preferable effect therefrom.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A liquid cooling system for an electronic apparatus having a heat-generating element within a housing thereof, comprising:
    a heat-receiving jacket for transferring heat generated from a heat-generating element to a liquid coolant, said heat-receiving jacket including a bottom surface having a plurality of grooves which intersect each other and an inclined shape which reaches a peak around a central portion thereof, wherein the liquid coolant becomes evaporated within the heat-receiving jacket to form an evaporated coolant and the evaporated coolant exits from an outlet of said jacket;
    a conduit having a first end thereof connected to the outlet of said heat-receiving jacket and conducting the evaporated coolant therein;
    a radiator connected to a second end of said conduit for guiding the evaporated coolant supplied from said heat-receiving jacket into said radiator, so as to cool and condense the evaporated coolant to become condensed liquid coolant; and a driving means including a Peltier element for applying a driving force for circulating the liquid coolant as a whole by repeatedly heating and cooling a portion of the condensed liquid coolant supplied from said radiator to create pressure changes, said driving means restricting a flow of the condensed liquid coolant within said driving means into one direction to an inlet of said heat-receiving jacket, thereby circulating the liquid coolant in one direction within a closed circulation loop including said heat-receiving jacket, said radiator, and said driving means, wherein the peak of the bottom surface does not extend past said conduit when seen from a side view, wherein said driving means includes a driving means inlet for receiving liquid coolant from said radiator, a driving means outlet for supplying liquid coolant to said heat-receiving jacket, a first check valve provided after the driving means outlet, and a second check valve provided prior to the driving means inlet, wherein the driving means inlet is positioned higher than the driving means outlet, and wherein the driving means, the heat receiving jacket, and the radiator are connected in series to form the closed circulation loop.

2. The liquid cooling system, as described in claim 1, wherein said driving means includes a portion for storing therein a part of the condensed liquid coolant supplied from said radiator, wherein an interior surface of said driving means enables evaporation of the condensed liquid coolant.

3. The liquid cooling system as described in claim 1, wherein said heat-receiving jacket has an interior surface which is enables evaporation of the liquid coolant.

* * * * *